United States Patent
Ikai et al.

[11] Patent Number: 5,997,637
[45] Date of Patent: Dec. 7, 1999

[54] METHOD OF PRODUCING A SEMICONDUCTING MATERIAL

[75] Inventors: Keizo Ikai; Masaki Minami; Mitsuo Matsuno, all of Yokohama, Japan

[73] Assignee: Nippon Oil Co., Ltd., Tokyo, Japan

[21] Appl. No.: 08/631,493

[22] Filed: Apr. 12, 1996

Related U.S. Application Data

[63] Continuation-in-part of application No. 08/261,576, Jun. 17, 1994, abandoned.

[30] Foreign Application Priority Data

Jun. 18, 1993 [JP] Japan .................................. 5-172358

[51] Int. Cl.$^6$ ................................................... C30B 29/54
[52] U.S. Cl. ............................ 117/73; 117/919; 117/925; 117/927; 438/385; 438/398
[58] Field of Search .................................. 438/398, 385; 117/73, 919, 925, 927

[56] References Cited

U.S. PATENT DOCUMENTS

| | | | |
|---|---|---|---|
| 5,220,181 | 6/1993 | Kanai et al. | 257/40 |
| 5,258,334 | 11/1993 | Lantz, II | 437/238 |
| 5,304,622 | 4/1994 | Ikai et al. | 528/16 |
| 5,342,982 | 8/1994 | Mnani et al. | 556/431 |
| 5,358,987 | 10/1994 | Kanai et al. | 524/254 |

FOREIGN PATENT DOCUMENTS

| | | |
|---|---|---|
| 0 264 722 A3 | 4/1988 | European Pat. Off. . |
| 0 282 037 A3 | 9/1988 | European Pat. Off. . |
| 0 445 306 A1 | 9/1991 | European Pat. Off. . |
| 5-025 281 | 2/1993 | Japan . |
| 5-025 282 | 2/1993 | Japan . |

OTHER PUBLICATIONS

Communication, European Search Report and Annex to European Search Report on European Patent Application No. EP 94 30 4431.

*Primary Examiner*—Robert Kunemund
*Attorney, Agent, or Firm*—Akin, Gump, Strauss, Hauer & Feld, L.L.P.

[57] ABSTRACT

A method of producing a semiconducting material comprises reacting one or more of halogenosilanes with an alkali metal and/or an alkaline earth metal in an inert solvent to give a condensate and thermally decomposing the condensate. The condensate is dissolved in a suitable solvent such as toluene and tetrahydrofuran and applied by casting to a suitable substrate. The resulting semiconductor material in its film form has an optical band-gap (EO) of usually 0.1–4.0 eV.

9 Claims, No Drawings

METHOD OF PRODUCING A SEMICONDUCTING MATERIAL

CROSS-REFERENCE TO RELATED APPLICATION

This is a continuation-in-part of application Ser. No. 08/261,576, filed Jun. 17, 1994, now abandoned.

FIELD OF THE INVENTION

This invention relates to a method of producing a semiconducting material for use in the formation of diodes, transistors, field effect transistors, thyristors and like semiconductor elements.

PRIOR ART

A gas-phase crystal growth procedure has found extensive use in the production of thin films of amorphous silicone or compound semiconductors in which their low molecular weight feedstock in gaseous phase is thermally decomposed or chemically reacted in high vacuum to deposit on a substrate. This method however would involve prohibitive costs to reduce to practice for making large semiconductor films because there will be required large-scale vacuum devices on one hand and there is a limitation imposed upon the rate of film deposition on the other.

SUMMARY OF THE INVENTION

With the foregoing drawbacks of the prior art in view, the present invention seeks to provide an improved method of producing semiconducting materials at a maximum rate of efficiency and a minimum of costs.

According to the invention, there is provided a method of producing semiconducting materials having an optical band-gap Eo of 0.1–4.0 eV which comprises reacting one or more of halogenosilanes of the group consisting of:

a halogenomonosilane of the formula

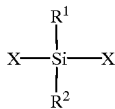

(I)

wherein $R^1$ and $R^2$ are identical or different and each include X which is chlorine, bromine or iodine, $C_3$–$C_{12}$ secondary alkyl, tertiary alkyl and cycloalkyl groups, $C_8$–$C_{12}$ primary, secondary and tertiary aralkyl groups, silyl groups of the formula $$R^3R^4R^5Si-\tag{I'}$$

wherein $R^3$, $R^4$ and $R^5$ are identical or different and each include $C_1$–$C_8$ alkyl groups and $C_6$–$C_{10}$ aryl groups, and X which is chlorine, bromine or iodine, a halogenodisilane of the formula

(II)

wherein $R^6$–$R^{10}$ are identical or different and each include $C_3$–$C_{12}$ secondary alkyl, tertiary alkyl and cycloalkyl groups, $C_8$–$C_{12}$ primary, secondary and tertiary aralkyl groups, said silyl groups (I') and X which is chlorine, bromine or iodine, either one of $R^6$–$R^{10}$ being invariably X, and a halogenotrisilane of the formula

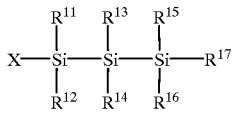

(III)

wherein $R^{11}$–$R^{17}$ are identical or different and each include $C_3$–$C_{12}$ secondary alkyl, tertiary alkyl and cycloalkyl groups, $C_8$–$C_{12}$ primary, secondary and tertiary aralkyl groups, said silyl groups (I') and X which is chlorine, bromine or iodine, either one of $R^{11}$–$R^{17}$ being invariably X, in the presence of one or more halogenosilanes of the formulae (I)–(III) having at least three halogen atoms, with an alkali metal and/or an alkaline earth metal to give a condensate, and thermally decomposing said condensate.

DETAILED DESCRIPTION OF THE INVENTION

The term halogenomonosilane of the formula (I) according to the invention preferably includes tetrachlorosilane, i-propyltrichlorosilane, t-butyltrichlorosilane, (1-methylpropyl)trichlorosilane, cyclohexyltrichlorosilane, (1,1,2-trimethylpropyl)trichlorosilane, α-phenethyltrichlorosilane, cumenyltrichlorosilane, (trimethylsilyl)trichlorosilane, di-i-propyldichlorosilane, di-t-butyldichlorosilane, di(1-methylpropyl)dichlorosilane, dicyclohexyldichlorosilane, di-α-phenethyldichlorosilane and bis(trimethylsilyl)dichlorosilane, and further includes tetrabromosilane, i-propyltribromosilane, t-butyltribromosilane, (1-methylpropyl)tribromosilane, cyclohexyltribromosilane, (1,1,2-trimethylpropyl) tribromosilane, α-phenethyltribromosilane, cumenyltribromosilane, (trimethylsilyl)tribromosilane, di-i-propyldibromosilane, di-t-butyldibromosilane, di(1-methylpropyl)dibromosilane, dicyclohexyldibromosilane, di-α-phenethyldibromosilane, bis(trimethylsilyl) dibromosilane, tetraiodosilane, i-propyltriiodosilane, t-butyltriiodosilane, (1-methylpropyl)triiodosilane, cyclohexyltriiodosilane, (1,1,2-trimethylpropyl) triiodosilane, α-phenethyltriiodosilane, cumenyltriiodosilane, (trimethylsilyl)triiodosilane, di-i-propyldiiodosilane, di-t-butyldiiodosilane, di(1-methylpropyl)diiodosilane, dicyclohexyldiiodosilane, di-α-phenethyldiiodosilane and bis(trimethylsilyl)diiodosilane.

Halogenodisilanes of the formula (II) preferably include hexachlorodisilane, i-propylpentachlorodisilane, t-butylpentachlorodisilane, (1-methylpropyl) pentachlorodisilane, cyclohexylpentachlorodisilane, (1,1,2-trimethylpropyl)pentachlorodisilane, α-phenethylpentachlorodisilane, cumenylpentachlorodisilane, (trimethylsilyl) pentachlorodisilane, 1,1-di-i-propyltetrachlorodisilane, 1,1-di-t-butyltetrachlorodisilane, 1,1-di(1-methylpropyl) tetrachlorodisilane, 1,1-dicyclohexyltetrachlorodisilane, 1,1-di-α-phenethyltetrachlorodisilane, 1,1-bis (trimethylsilyl)tetrachlorodisilane, 1,2-di-i-propyltetrachlorodisilane, 1,2-di-t-butyltetrachlorodisilane, 1,2-di(1-methylpropyl)tetrachlorodisilane, 1,2-dicylohexyltetrachlorodisilane, 1,2-di-α- phenethyltetrachlorodisilane and 1,2-bis(trimethylsilyl) tetrachlorodisilane. They further include 1,1,1-tri-i-propyltrichlorodisilane, 1,1,1-tri-t-butyltrichlorodisilane, 1,1,1-tri(1-methylpropyl)trichlorodisilane, 1,1-tricyclohexyltrichlorodisilane, 1,1,1-tri-α-phenethyltrichlorodisilane, 1,1,1-tris(trimethylsilyl) trichlorodisilane, 1,1,2-tri-i-propyltrichlorodisilane, 1,1,2-tri-t-butyltrichlorodisilane, 1,1,2-tri(1-methylpropyl) trichlorodisilane, 1,1,2-tricyclohexyltrichlorodisilane, 1,1,2-tri-α-phenethyltrichlorodisilane, 1,1,2-tris(trimethylsilyl) trichlorodisilane, hexabromodisilane, i-propylpentabromodisilane, t-butylpentabromodisilane, (1-methylpropyl)pentabromodisilane, cyclohexylpentabromodisilane, (1,1,2-trimethylpropyl) pentabromodisilane, α-phenethylpentabromodisilane, cumenylpentabromodisilane, (trimethylsilyl) pentabromodisilane, 1,1-di-i-propyltetrabromodisilane, 1,1-di-t-butyltetrabromodisilane, 1,1-di(1-methylpropyl) tetrabromodisilane, 1,1-dicyclohexyltetrabromodisilane, 1,1-di-α-phenethyltetrabromodisilane, 1,1-bis (trimethylsilyl)tetrabromodisilane, 1,2-di-i-propyltetrabromodisilane, 1,2-di-t-butyltetrabromodisilane, 1,2-di(1-methylpropyl)tetrabromodisilane, 1,2-dicyclohexyltetrabromodisilane, 1,2-di-α-phenethyltetrabromodisilane, 1,2-bis(trimethylsilyl) tetrabromodisilane, 1,1,1-tri-i-propyltribromodisilane, 1,1,1-tri-t-butyltribromodisilane, 1,1,1-tri(1-methylpropyl) tribromodisilane, 1,1,1-tricyclohexyltribromodisilane, 1,1,1-tri-α-phenethyltribromodisilane, 1,1,1-tris(trimethylsilyl) tribromodisilane, 1,1,2-tri-i-propyltribromodisilane, 1,1,2-tri-t-butyltribromodisilane, 1,1,2-tri(1-methylpropyl) tribromodisilane, 1,1,2-tricyclohexyltribromodisilane, 1,1,2-tri-α-phenethyltribromodisilane, 1,1,2-tris(trimethylsilyl) tribromodisilane, hexaiododisilane, i-propylpentaiododisilane, t-butylpentaiododisilane, (1-methylpropyl)pentaiododisilane, cyclohexylpentaiododisilane, (1,1,2-triemthylpropyl) pentaiododisilane, α-phenethylpentaiododisilane, cumenylpentaiododisilane, (trimethylsilyl) pentaiododisilane, 1,1-di-i-propyltetraiododisilane, 1,1-di-t-butyltetraiododisilane, 1,1-di(1-methylpropyl) tetraiododisilane, 1,1-dicyclohexyltetraiododisilane, 1,1-di-α-phenethyltetraiododisilane, 1,1-bis(trimethylsilyl) tetraiododisilane, 1,2-di-i-propyltetraiododisilane, 1,2-di-t-butyltetraiododisilane, 1,2-di(1-methylpropyl) tetraiododisilane, 1,2-dicyclohexyltetraiododisilane, 1,2-di-α-phenethyltetraiododisilane, 1,2-bis(trimethylsilyl) tetraiododisilane, 1,1,1-tri-i-propyltriiododisilane, 1,1,1-tri-t-butyltriiododislane, 1,1,1-tri(1-methylpropyl) triiododisilane, 1,1,1-tricyclohexyltriiododisilane, 1,1,1-tri-α-phenethyltriiododisilane, 1,1,1-tris(trimethylsilyl) triiododisilane, 1,1,2-tri-i-propyltriiododisilane, 1,1,2-tri-t-butyltriiododisilane, 1,1,2-tri(1-methylpropyl) triiododisilane, 1,1,2-tricyclohexyltriiododisilane, 1,1,2-tri-α-phenethyltriiododisilane and 1,1,2-tris(trimethylsilyl) triiododisilane.

Halogenotrisilanes of the formula (III) preferably include octachlorotrisilane, 1-i-propylheptachlorotrisilane, 1-t-butylheptachlorotrisilane, 1-(1-methylpropyl) heptachlorotrisilane, 1-cyclohexylheptachlorotrisilane, 1-(1,1,2-trimethylpropyl)heptachlorotrisilane, 1-α-phenethylheptachlorotrisilane, 1-cumenylheptachlorotrisilane, 1-(trimethylsilyl) heptachlorotrisilane, 2-i-propylheptachlorotrisilane, 2-t-butylheptachlorotrisilane, 2-(1-methylpropyl) heptachlorotrisilane, 2-cyclohexylheptachlorotrisilane, 2-(1,1,2-trimethylpropyl)heptachlorotrisilane, 2-α-phenethylheptachlorotrisilane, 2-cumenylheptachlorotrisilane, 2-(trimethylsilyl) heptachlorotrisilane, 1,1-di-i-propylhexachlorotrisilane, 1,1-di-t-butylhexachlorotrisilane, 1,1-di(1-methylpropyl) hexachlorotrisilane, 1,1-dicyclohexylhexachlorotrisilane, 1,1-di-α-phenethylhexachlorotrisilane, 1,1-bis (trimetylsilyl)hexachlorotrisilane, 1,2-di-i-propylhexachlorotrisilane, 1,2-di-t-butylhexachlorotrisilane, 1,2-di(1-methylpropyl)hexachlorotrisilane, 1,2-dicyclohexylhexachlorotrisilane, 1,2-di-α-phenethylhexachlorotrisilane, 1,2-bis(trimethylsilyl) hexachlorotrisilane, 1,3-di-i-propylhexachlorotrisilane, 1,3-di-t-butylhexachlorotrisilane, 1,3-di(1-methylpropyl) hexachlorotrisilane, 1,3-dicyclohexylhexachlorotrisilane, 1,3-di-α-phenethylhexachlorotrisilane, 1,3-bis (trimethylsilyl)hexachlorotrisilane, 1,1,1-tri-i-propylpentachlorotrisilane, 1,1,1-tri-t-butylpentachlorotrisilane, 1,1,1-tri(1-methylpropyl) pentachlorotrisilane, 1,1,1-tricyclohexylpentachlorotrisilane, 1,1,1-tri-α-phenethylpentachlorotrisilane, 1,1,1-tris(trimethylsilyl) pentachlorotrisilane, 1,1,2-tri-i-propylpentachlorotrisilane, 1,1,2-tri-t-butylpentachlorotrisilane, 1,1,2-tri(1-methylpropyl)pentachlorotrisilane, 1,1,2-tricyclohexylpentachlorotrisilane, 1,1,2-tri-α-phenethylpentachlorotrisilane, 1,1,2-tris(trimethylsilyl) pentachlorotrisilane, 1,2,3-tri-i-propylpentachlorotrisilane, 1,2,3-tri-t-butylpentachlorotrisilane, 1,2,3-tri(1-methylpropyl)pentachlorotrisilane, 1,2,3-tricyclohexylpentachlorotrisilane, 1,2,3-tri-α-phenethylpentachlorotrisilane and 1,2,3-tris(trimethylsilyl) pentachlorotrisilane.

Examples of other halogenotrisilanes eligible for the purpose of the invention include octabromotrisilane, 1-i-propylheptabromotrisilane, 1-t-butylheptabromotrisilane, 1-(1-methylpropyl)heptabromotrisilane, 1-cyclohexylheptabromotrisilane, 1-(1,1,2-trimethylpropyl) heptabromotrisilane, 1-α-phenethylheptabromotrisilane, 1-cumenylheptabromotrisilane, 1-(trimethylsilyl) heptabromotrisilane, 2-i-propylheptabromotrisilane, 2-t-butylheptabromotrisilane, 2-(1-methylpropyl) heptabromotrilane, 2-cyclohexylheptabromotrisilane, 2-(1,1,2-trimethylpropyl)heptabromotrisilaine, 2-α-phenethylheptabromotrisilane, 2-cumenylheptabromotrisilane, 2-(trimethylsilyl) heptabromotrisilane, 1,1-di-i-propylhexabromotrisilane, 1,1-di-t-butylhexabromotrisilane, 1,1-di(1-methylpropyl) hexabromotrisilane, 1,1-dicyclohexylhexabromotrisilane, 1,1-di-α-phenethylhexabromotrisilane, 1,1-bis (triemthylsilyl)hexabromotrisilane, 1,2-di-i-propylhexabromotrisilane, 1,2-di-t-butylhexabromotrisilane, 1,2-di(1-methylpropyl) hexabromotrisilane, 1,2-dicyclohexylbromotrisilane, 1,2-di-α-phenethylhexabromotrisilane, 1,2-bis(trimethylsilyl) hexabromotrisilane, 1,3-di-i-propylhexabromotrisilane, 1,3-di-t-butylhexabromotrisilane, 1,3-di(1-methylpropyl) hexabromotrisilane, 1,3-dicyclohexylhexabromotrisilane, 1,3-di-α-phenethylhexabromotrisilane, 1,3-bis (trimethylsilyl)hexabromotrisilane, 1,1,1-tri-i-propylpentabromotrisilane, 1,1,1-tri-t-butylpentabromotrisilane, 1,1,1-tri(1-methylpropyl) pentabromotrisilane, 1,1,1-tricyclohexylpentabromotrisilane, 1,1,1-tri-α-phenethylpentabromotrisilane, 1,1,1-tris(trimethylsilyl) pentabromotrisilane, 1,1,2-tri-i-propylpentabromotrisilane, 1,1,2-tri-t-butylpentabromotrisilane, 1,1,2-tri(1-methylpropyl)pentabromotrisilane, 1,1,2- tricyclohexylpentabromotrisilane, 1,1,2-tri-α-phenethylpentabromotrisilane, 1,1,2-tris(trimethylsilyl)pentabromotrisilane, 1,2,3-tri-i-propylpentabromotrisilane, 1,2,3-tri-t-butylpentabromotrisilane, 1,2,3-tri(1-methylpropyl)pentabromotrisilane, 1,2,3-tricyclohexylpentabromotrisilane, 1,2,3-tri-α-phenethylpentabromotrisilane, 1,2,3-tris(trimethylsilyl)pentabromotrisilane, octaiodotrisilane, 1-i-propylheptaiodotrisilane, 1-t-butylheptaiodotrisilane, 1-(1-methylpropyl)heptaiodotrisilane, 1-cyclohexylheptaiodotrisilane, 1-(1,1,2-trimethylpropyl)heptaiodotrisilane, 1-α-phenethylheptaiodotrisilane, 1-cumenylheptaiodotrisilane, 1-(trimethylsilyl)heptaiodotrisilane, 2-i-propylheptaiodotrisilane, 2-t-butylheptaiodotrisilane, 2-(1-methylpropyl)heptaiodotrisilane, 2-cyclohexylheptaiodotrisilane, 2-(1,1,2-trimethylpropyl)heptaiodotrisilane, 2-α-phenethylheptaiodotrisilane, 2-cumenylheptaiodotrisilane, 2-(trimethylsilyl)heptaiodotrisilane, 1,1-di-i-propylhexaiodotrisilane, 1,1-di-t-butylhexaiodotrisilane, 1,1-di(1-methylpropyl)hexaiodotrisilane, 1,1-dicyclohexylhexaiodotrisilane, 1,1-di-α-phenethylhexaiodotrisilane, 1,1-bis(trimethylsilyl)hexaiodotrisilane, 1,2-di-i-propylhexaiodotrisilane, 1,2-di-t-butylhexaiodotrisilane, 1,2-di(1-methylpropyl)hexaiodotrisilane, 1,2-dicyclohexylhexaiodotrisilane, 1,2-di-α-phenethylhexaiodotrisilane, 1,2-bis(trimethylsilyl)hexaiodotrisilane, 1,3-di-i-propylhexaiodotrisilane, 1,3-di-t-butylhexaiodotrisilane, 1,3-di(1-methylpropyl)hexaiodotrisilane, 1,3-dicyclohexylhexaiodotrisilane, 1,3-di-α-phenethylhexaiodotrisilane, 1,3-bis(trimethylsilyl)hexaiodotrisilane, 1,1,1-tri-i-propylpentaiodotrisilane, 1,1,1-tri-t-butylpentaiodotrisilane, 1,1,1-tri(1-methylpropyl)pentaiodotrisilane, 1,1,1-tricyclohexylpentaiodotrisilane, 1,1,1-tri-α-phenethylpentaiodotrisilane, 1,1,1-tris(trimethylsilyl)pentaiodotrisilane, 1,1,2-tri-i-propylpentaiodotrisilane, 1,1,2-tri-t-butylpentaiodotrisilane, 1,1,2-tri(1-methylpropyl)pentaiodotrisilane, 1,1,2-tricyclohexylpentaiodotrisilane, 1,1,2-tri-α-phenethylpentaiodotrisilane, 1,1,2-tris(trimethylsilyl)pentaiodotrisilane, 1,2,3-tri-i-propylpentaiodotrisilane, 1,2,3-tri-t-butylpentaiodotrisilane, 1,2,3-tri(1-methylpropyl)pentaiodotrisilane, 1,2,3-tricyclohexylpentaiodotrisilane, 1,2,3-tri-α-phenethylpentaiodotrisilane and 1,2,3-tris(trimethylsilyl)pentaiodotrisilane.

The above exemplified halogenosilane compounds are reacted with an alkali metal and/or an alkaline earth metal in the presence of one or more halogenosilanes of the formulae (I)–(III) having at least three, preferably 3 to 8, halogen atoms usually in an inert solvent. This reaction is known as Wurtz condensation. A halogenosilane having at least three halogen atoms is used in an amount of usually 0.1 to 100 mole %, preferably 1 to 100 mole %, more preferably 50 to 100 mole % based on the total amount of halogenosilanes to be reacted.

The term inert solvent used in the invention includes a hydrocarbon solvent such as toluene, xylene, heptane, decane and dodecane, and an ether solvent such as diethyl ether, isopropyl ether, methylbutylether, dimethoxy ethane, tetrahydrofuran and dioxane. These solvents may be used singly or in combination.

The solvent is used in an amount of usually 1–100 parts by volume, preferably 5–50 parts by volume per part by volume of the halogenosilane compound.

Examples of the alkali metal with which the halogenosilane is reacted include lithium, potassium, sodium, and examples of the alkaline earth metal include magnesium and calcium. These metals may be used singly or in combination. The amount of such a metal to be used is usually 1–100 mols, preferably 1–50 mols per mol of the halogenosilane compound.

The reaction is effected by introducing droplets of the halogenosilane compound into the inert solvent in which the metal is dispersed, or by introducing droplets of the metal dispersed solvent into the inert solvent in which the halogenosilane is dissolved. The reaction is conducted preferably in an argon or nitrogen gas atmosphere with or without ultrasonic irradiation. The reaction temperature is usually in the range of 0°–250° C., preferably 25°–210° C. The reaction pressure is usually in the range of atmospheric-200 kg/cm², preferably atmospheric-100 kg/cm². The reaction time is usually 5 minutes to 24 hours, preferably 30 minutes to 24 hours, though dependent upon the reaction temperature and the type of reaction metal used. The Wurtz condensation reaction may be carried out in the presence of crown ethers such as 12-crown-4, 15-crown-5, 18-crown-6, dibenzo-12-crown-4, dibenzo-15-crown-5 and dibenzo-18-crown-6, or diamines such as tetramethylethylene-diamine. These additives may be used in an amount of usually 0.01–100 mols, preferably 0.01–50 mols per mol of the halogenosilane.

Upon completion of the reaction, the reaction system is added with an alcohol such as methanol and ethanol to render unreacted metals inert, followed by washing with water to remove NaCl and other by-products. The reaction solution is thereafter introduced into methanol, ethanol, IPA, ethyl acetate, pentane or hexane thereby allowing the resultant condensate to precipitate. The condensate may be otherwise refined by contact with Florisil (tradename). These processes may also be combined.

The condensate may be determined as to its structure by means of infrared or ultraviolet absorption spectrum, nuclear magnetic resonance (such as $^1$HNMR, $^{13}$CNMR and $^{29}$SiNMR) and gel permeation chromatography.

The condensate obtained in accordance with the invention usually contains repeating units of the formulae

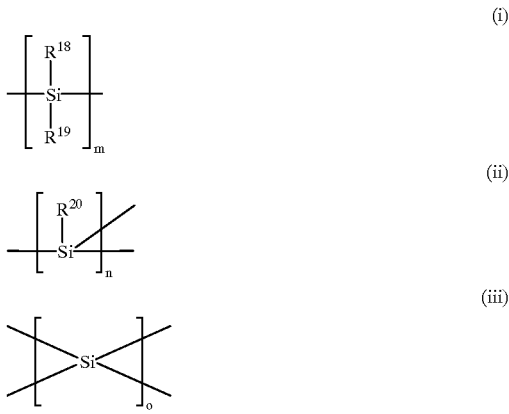

wherein $R^{18}$, $R^{19}$, and $R^{20}$ are identical or different, and each include $C_3$–$C_{12}$ secondary and tertiary alkyl and cycloalkyl groups, $C_8$–$C_{12}$ primary, secondary and tertiary aralkyl groups, the silyl groups (formula I'), and X, which is chlorine, bromine or iodine. The ratios of m, n and o may vary according to the type of the starting monomer, feedstock used and the relative amounts of two or more different halogenosilanes that may be used. The value n/m is usually 0–1,000, preferably 0–100, and the value o/n is usually 0–1,000, preferably 0–100.

The polysilane has a polymerization degree of usually 6–2,000 and a weight average molecular weight (Mw) of usually 100–10,000,000, preferably 500–1,000,000 and a number average molecular weight (Mn) of usually 100–1,000,000, preferably 300–500,000.

The condensate product is subjected to thermal decomposition in which it is dissolved in a suitable solvent such as toluene and tetrahydrofuran and cast over a sheet of quartz or stainless steel, or a silicon wafer. Alternatively, the condensate may be thermally decomposed after it is processed into a fibrous or pellet form. The thermal decomposition is effected in the presence of an inert gas such as argon and nitrogen or in a vacuum of $10^{-5}$–$10^4$ pa, preferably $10^{-3}$–$10^3$ pa and at a temperature of 100°–2,000° C., preferably 200°–1,000° C. It may be effected in the presence of a reducing gas such as hydrogen or a mixture of this and the inert gas, in which case the reducing gas is used in an amount of 0.1–100%, preferably 1–50% relative to the inert gas. The thermal decomposition reaction may be further effected in the presence of a vapor such as of iodine, ferric chloride, antimony pentafluoride, antimony pentachloride, arsenic pentafluoride, phosphorus trichloride, boron tribromide and aluminum trichloride, the amount of addition thereof being 1 vol.ppt–10 vol.%, preferably 1 vol.ppt–1 vol.%.

The semiconducting material derived from the inventive process ranges in hue from yellow to dark brown, to glossy silver and has in the case of a film a thickness of usually 0.01 μm–500 μm, preferably 0.1 μm–50 μm, and an optical band-gap (EO) of usually 0.1–4.0 eV, preferably 0.5–2.0 eV.

The invention will be further described by way of the following examples.

The optical band-gap value Eo appearing in the Examples have been obtained by the procedure in which the inventive semiconductor film was applied to a sheet of synthetic quartz glass (ED-B, manufactured by Nippon Silica Glass Co., Ltd. and measuring 50×50×0.7 mm in size and having a 90% or greater light permeation at 200 nm). The glass sheet was irradiated with light from the side of the film to measure a light permeation spectrum and then a light absorption spectrum therefrom. The latter spectrum was analyzed to determine the optical band-gap Eo of each test sample based on the formula $$\sqrt{\alpha \cdot \frac{h}{2\pi} \cdot \omega} \propto \frac{h}{2\pi} \cdot \omega - Eo$$

wherein
α=absorption coefficient (cm$^{-1}$)
h=Planck's constant
ω=oscillation frequency
h/2π·ω=photon energy (eV).

EXAMPLE 1

A 100 ml four-neck flask equipped with stirring blade, reflux condenser and funnel was charged with metallic sodium (1.4 g., 40 mmols) and anhydrous toluene (20 mmols) and heated with stirring. When reflux began, a toluene solution (10 ml) of 1-methylpropyl-pentachlorodisilane (3.0 g., 10 mmols) was added dropwise under vigorous agitation. The reaction mixture immediately turned violet and subsequently, reflux with stirring continued for one hour, followed by cooling to room temperature and addition of methanol. The reaction mixture was thereafter combined with ether (60 ml), washed with water and dried. The resulting condensate was refined by precipitation in toluene-methanol until there was obtained a yellowish powdery condensate product (0.29 g., yield 26%).

A toluene solution of the condensate was applied by casting to a sheet of quartz glass and then heated at 700° C. for one hour in an argon atmosphere to give a dark brown film (0.1 μm thick). The film showed a conductivity of $10^{-6}$ S/cm and an optical band-gap (Eo) of 1.7 eV.

EXAMPLE 2

The procedure of Example 1 was followed except that a mixture of cyclohexyltrichlorosilane (2.2 g., 100 mmols) and silicon tetrachloride (0.85 g., 5.0 mmols) was used. There was obtained a yellowish powdery condensate (1.19 g., yield 19%).

A toluene solution of the condensate was applied by casting to a sheet of quartz glass and then heated at 700° C. for one hour in an argon atmosphere to give a dark brown film (0.2 μm thick). The film showed a conductivity of $10^{-4}$ S/cm and an optical band-gap (Eo) of 1.5 eV.

EXAMPLE 3

The procedure of Example 1 was followed except that a mixture of 1,3-di-n-hexylhexa chlorotrisilane (0.8 g., 1.70 mmols), potassium-sodium alloy (0.84 g., 13.6 mmols) and 18-crown-6 (26 mg., 0.1 mmol) was used. There was obtained a yellowish powdery condensate (99 mg., yield 23%).

A toluene solution of the condensate was cast over a sheet of quartz glass and then heated at 600° C. for three hours in an argon atmosphere to give a dark brown film. The film exhibited a conductivity of $10^{-6}$ S/cm and an optical band-gap (Eo) of 1.8 eV.

What is claimed is:

1. A method of producing a semiconducting material having an optical band-gap $E_o$ of 0.1–4.0 eV, said method comprising:

(a) reacting one or more halogenosilanes selected from the group consisting of halogenomonosilanes, halogenodisilanes, and halogenotrisilanes, with a co-reactant selected from the group consisting of alkali metals and alkaline earth metals, to produce a condensate; and (b) thermally decomposing said condensate;
   with the proviso that at least one of the one or more halogenosilanes used in step (a) and represented by the formulas (I)–(III) below has at least three substituents represented by X, wherein the halogenomonosilanes are represented by the formula (I)

(I)

wherein X is selected from the group consisting of chlorine, bromine, and iodine; and R$^1$ and R$^2$ are independently selected from the group consisting of X, C$_3$–C$_{12}$ secondary alkyls, C$_4$–C$_{12}$ tertiary alkyls, C$_3$–C$_{12}$ cycloalkyls, C$_8$–C$_{12}$ primary aralkyls, C$_8$–C$_{12}$ secondary aralkyls, C$_9$–C$_{12}$ tertiary aralkyls, and silyl groups of the formula (I')

(I')

wherein R$^3$, R$^4$ and R$^5$ are independently selected from the group consisting of C$_1$–C$_8$ alkyls and C$_6$–C$_{10}$ aryls; and the halogenodisilanes are represented by the formula (II)

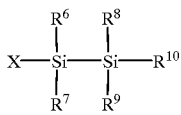

(II)

wherein X is as defined above and $R^6$–$R^{10}$ are independently selected from the group consisting of X, $C_3$–$C_{12}$ secondary alkyls, $C_4$–$C_{12}$ tertiary alkyls, $C_3$–$C_{12}$ cycloalkyls, $C_8$–$C_{12}$ primary aralkyls, $C_8$–$C_{12}$ secondary aralkyls, $C_9$–$C_{12}$ tertiary aralkyls and said silyl groups of the formula (I'), and at least one of $R^6$–$R^{10}$ is X; and wherein the halogenotrisilanes are represented by the formula (III)

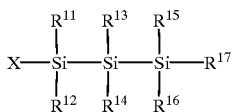

(III)

wherein X is as defined above and $R^{11}$–$R^{17}$ are independently selected from the group consisting of X, $C_3$–$C_{12}$ secondary alkyls, $C_4$–$C_{12}$ tertiary alkyls, $C_3$–$C_{12}$ cycloalkyls, $C_8$–$C_{12}$ primary aralkyls, $C_8$–$C_{12}$ secondary aralkyls, $C_9$–$C_{12}$ tertiary aralkyls, and said silyl groups of the formula (I'), and at least one of $R^{11}$–$R^{17}$ is X.

2. A method as defined in claim 1 wherein said alkali metal is selected from the group of lithium, potassium and sodium, and said alkaline earth metal is selected from the group of magnesium and calcium, said alkali metal and/or said alkaline earth metal being used in an amount of 1–100 mols per mol of said halogenosilane.

3. A method as defined in claim 1 wherein said reaction is conducted in an inert solvent selected from the group consisting of toluene, xylene, heptane, decane, dodecane, diethylether, isopropylether, methylbutyl ether, dimethoxy ethane, tetrahydrofuran and dioxane, said inert solvent being used in an amount of 1–100 parts by volume per 1 part by volume of said halogenosilane.

4. A method as defined in claim 1 wherein said one or more halogenosilanes are reacted with said alkali metal and/or said alkaline earth metal at a temperature of 0°–250° C. for a time length of 5 minutes to 24 hours.

5. A method as defined in claim 1 wherein said condensate is thermally decomposed in an inert gas atmosphere, or in a vacuum of $10^{-5}$–$10^4$ pa, at a temperature of 100°–2,000° C.

6. A method as defined in claim 1 wherein said semiconducting material has an optical band-gap Eo of 0.5 to 2.0 eV.

7. A method as defined in claim 1 wherein said semiconducting material is in the form of film.

8. A method as defined in claim 1 wherein said halogenosilane having at least three substituents represented by X is used in an amount of 0.1 to 100 mole % based on the total amount of the one or more halogenosilanes to be reacted.

9. A method as defined in claim 1 wherein said halogenosilane having at least three substituents represented by X is used in an amount of 50 to 100 mole % based on the total amount of the one or more halogenosilanes to be reacted.

* * * * *